(12) United States Patent  
Delbecq et al.

(10) Patent No.: US 11,496,122 B2
(45) Date of Patent: Nov. 8, 2022

(54) PHASE ROTATOR CALIBRATION APPARATUS AND METHOD THEREFOR

(71) Applicant: NXP USA, INC., Austin, TX (US)

(72) Inventors: Dominique Delbecq, Fonsorbes (FR); Olivier Vincent Doaré, La Salvetat St Gilles (FR); Julien Orlando, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/361,590

(22) Filed: Jun. 29, 2021

(65) Prior Publication Data
US 2022/0021378 A1    Jan. 20, 2022

(30) Foreign Application Priority Data

Jul. 17, 2020  (EP) .................................. 20305827

(51) Int. Cl.
| | | |
|---|---|---|
| H03K 5/00 | (2006.01) | |
| H03K 5/01 | (2006.01) | |
| H03K 5/1252 | (2006.01) | |
| H03D 7/00 | (2006.01) | |

(52) U.S. Cl.
CPC ............. *H03K 5/01* (2013.01); *H03K 5/1252* (2013.01); *H03D 7/00* (2013.01)

(58) Field of Classification Search
None
See application file for complete search history.

(56) References Cited

U.S. PATENT DOCUMENTS

| | | |
|---|---|---|
| 6,574,286 B2 | 6/2003 | McVey |
| 6,754,286 B2 * | 6/2004 | Hottinen ................ H04L 1/06 375/299 |
| 8,885,692 B2 | 11/2014 | Ly-Gagnon |
| 9,923,269 B1 | 3/2018 | Hageman et al. |
| 2003/0128660 A1 | 7/2003 | Ito et al. |
| 2003/0185327 A1 | 10/2003 | Chen |
| 2004/0032913 A1 | 2/2004 | Dinur |
| 2004/0196925 A1 | 10/2004 | Moore et al. |
| 2005/0156662 A1 | 7/2005 | Raghupathy et al. |
| 2007/0025433 A1 | 2/2007 | Hammerschmidt et al. |
| 2007/0058702 A1 | 3/2007 | Zhang |
| 2008/0192877 A1 | 8/2008 | Eliezer et al. |
| 2010/0041353 A1 | 2/2010 | Alford et al. |
| 2014/0192923 A1 | 10/2014 | Matsuo et al. |
| 2017/0288762 A1 | 5/2017 | Miyanaga et al. |

(Continued)

OTHER PUBLICATIONS

Kalyoncu, I., "A Phase-Calibration Method for Vector-Sum Phase Shifters Using Self-Generated LUT", IEEE Transactions on Circuits and Systems I: Regular Papers, vol. 66, No. 4, Apr. 1, 2019.

(Continued)

*Primary Examiner* — Tuan T Lam

(57) ABSTRACT

A phase rotator calibration system is provided. The phase rotator calibration system includes a phase rotator portion having input for receiving an input signal and an output for providing an output signal. A calibration portion is coupled to the phase rotator portion. The calibration portion is configured to determine a phase error based on a phase estimation. The phase estimation is generated by way of an arccosine function.

17 Claims, 4 Drawing Sheets

(56) References Cited

U.S. PATENT DOCUMENTS

2020/0158821 A1* 5/2020 Doare ................... G01S 7/4013
2020/0400783 A1* 12/2020 Doare ..................... G01S 7/282

OTHER PUBLICATIONS

U.S. Appl. No. 17/451,828, filed Oct. 22, 2021 and entitled Method, Device, and Radar System.
Non-Final Office Action for U.S. Appl. No. 16/904,200 dated Sep. 20, 2022, 25 pages.

* cited by examiner

PHASE ROTATOR CALIBRATION APPARATUS AND METHOD THEREFOR

CROSS-REFERENCE TO RELATED APPLICATIONS

This application claims the priority under 35 U.S.C. § 119 of European Patent application no. 20305827.6, filed on 17 Jul. 2020, the contents of which are incorporated by reference herein.

BACKGROUND

Field

This disclosure relates generally to electronic circuits, and more specifically, to phase rotator calibration apparatus and method.

Related Art

Today, many integrated circuit (IC) and system-on-a-chip (SoC) devices for advanced automotive radar systems, for example, require high speed and high accuracy operation. The IC and SoC devices often include sophisticated circuitry for controlling these radar systems. As radar systems advance, requirements of the control circuits advance to meet performance targets. However, challenges exist in balancing product costs while meeting these performance targets.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a phase rotator calibration system including a calibration circuit configured to determine a phase error based on a phase estimation during a calibration mode. The phase estimation is generated digitally by way of an arccosine function. Phase error values are determined for an input signal swept over a range of phases in predetermined increments. A storage unit is utilized to store the phase error values during the calibration mode. The storage unit serves as a look-up table to pre-distort the input signal during a normal operating mode thus providing a calibrated phase rotator output signal.

Figure 1:
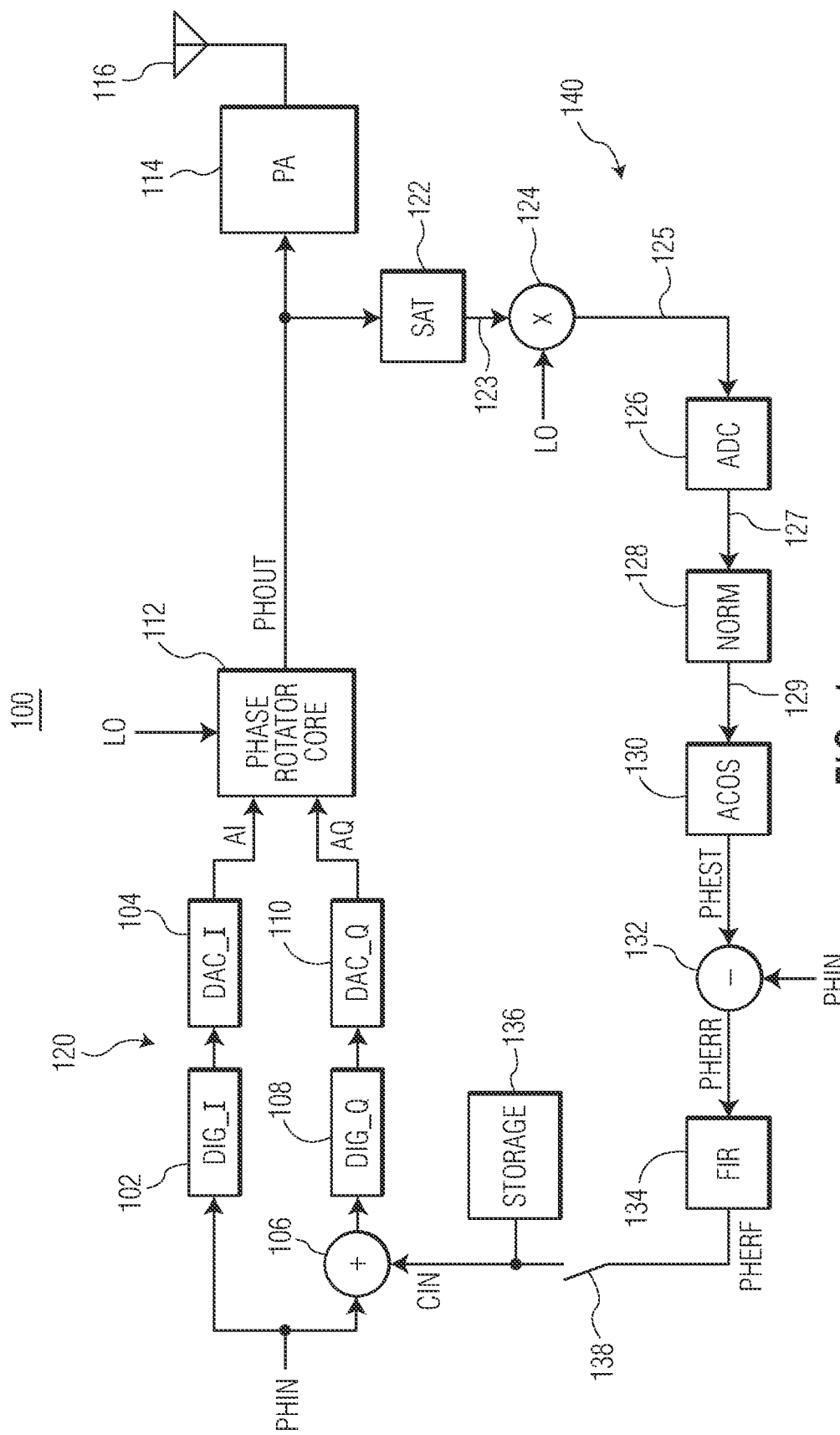
FIG. 1 illustrates, in simplified block diagram form, an example phase rotator calibration system in accordance with an embodiment.

FIG. 1 illustrates, in simplified block diagram form, an example phase rotator calibration system 100 in accordance with an embodiment. The phase rotator calibration system 100 includes a phase rotator circuit portion 120, a calibration circuit portion 140, a storage unit 136, and a switch circuit 138. The phase rotator circuit 120 has a first input labeled PHIN for receiving a phase input signal, a second input labeled CIN for receiving a calibration signal, a third input labeled LO for receiving a local oscillator signal, and an output labeled PHOUT for providing an output signal PHOUT. In this embodiment, the calibration signal is characterized as a phase error signal. The phase rotator calibration system 100 may be part of a transmitter system including a power amplifier 114 coupled to receive the PHOUT signal and an antenna 116 coupled to receive an output signal from the power amplifier 114. The calibration circuit 140 has a first input coupled to the PHOUT output for receiving the PHOUT signal, a second input labeled LO for receiving the local oscillator signal, a third input labeled PHIN for receiving the PHIN signal, and an output coupled to the CIN input and the storage unit 136 by way of the switch 138.

In this embodiment, the phase rotator circuit 120 has a first (I) signal component path and a second (Q) signal component path configured to generate a complex analog signal (e.g., AI and AQ) coupled as input signals to a phase rotator core circuit 112. The I signal component path includes a digital circuit block 102 labeled DIG_I and a digital to analog converter (DAC) circuit block 104 labeled DAC_I. The digital circuit block 102 includes an input for receiving the PHIN signal and is configured to generate at an output an I signal component of the PHIN signal based on a CORDIC algorithm. For example, the digital circuit block 102 is coupled to receive the PHIN signal and configured to generate a digital I signal component substantially in phase with the PHIN signal. The DAC circuit block 104 includes an input coupled to the output of the digital circuit block 102 to receive the I signal component and is configured to generate an analog signal labeled AI.

The Q signal component path includes mixer 106, digital circuit block 108 labeled DIG_Q, and DAC circuit block 110 labeled DAC_Q. The mixer 106 includes a first input for receiving the PHIN signal and a second input for receiving the CIN signal, and is configured to generate a summed signal (e.g., PHIN+phase error). The digital circuit block 108 includes an input for receiving the summed signal and is configured to generate at an output a Q signal component of the PHIN signal based on the CORDIC algorithm. For example, the digital circuit block 108 is coupled to receive the summed signal from mixer 106 and configured to generate a digital Q signal component substantially 90 degrees (+/−phase error contribution) out of phase with the PHIN signal. The DAC circuit block 110 includes an input coupled to the output of the digital circuit block 108 to receive the Q signal component and is configured to generate an analog signal labeled AQ.

The phase rotator core 112 is configured and arranged to receive the complex analog signal (e.g., AI and AQ) at a first set of inputs, the LO signal at another input, and in turn, generate the PHOUT signal at the output labeled PHOUT. In this embodiment, the LO signal is modulated by the respective AI and AQ signals and subsequently combined to generate the PHOUT signal.

The calibration circuit 140 is configured and arranged to receive the PHOUT, LO, and PHIN signals at inputs, and in turn, generate a phase error signal (e.g., PHERR) at output coupled to the CIN input and the storage unit. In this embodiment, the calibration circuit 140 includes a saturation circuit block 122 labeled SAT, an analog to digital converter (ADC) circuit block 126 labeled ADC, a normalization circuit block 128 labeled NORM, an arccosine functional circuit block 130 labeled ACOS, a filter circuit block 134 labeled FIR, and mixer circuits 124 and 132.

The saturation circuit 122 is configured to receive the PHOUT signal, and in turn, generate a saturated signal 123 corresponding to the PHOUT signal. The saturated signal version of the PHOUT signal is provided to mixer 124. The mixer 124 is configured to receive the saturated signal 123 at a first input, the LO signal at a second input, and in turn, generate a down-converted signal 125 at an output. The down-converted signal 125 is then provided to the ADC 126. The ADC is configured to receive at an input the down-converted, saturated signal version of the PHOUT signal, and in turn, generate at an output a digital signal 127 representative of the down-converted signal. The digital signal 127 is then provided to the normalization circuit 128. The normalization circuit 128 is configured to receive the digital signal 127 at an input, and in turn, generate at an output, a normalized digital signal 129 based on the digital signal. The normalized signal 129 is then provided to the arccosine circuit 130. In this embodiment, the arccosine circuit 130 is configured to receive the normalized signal 129 at an input, and in turn, generate a phase estimate signal labeled PHEST at an output. The received normalized signal is converted digitally into the phase estimate signal by way of an arccosine function performed by the arccosine circuit 130. The PHEST signal is then provided to mixer 132.

The mixer circuit 132 is configured and arrange to generate a phase error signal labeled PHERR based on a difference between the generated phase estimation signal PHEST and the phase input signal PHIN. A first input of mixer 132 is coupled to receive the PHEST signal, a second input of mixer 132 is coupled to receive the PHIN signal, and in turn, the mixer 132 generates the PHERR signal as a difference between the PHEST signal and the PHIN signal. The filter circuit 134 includes an input coupled to the output of the mixer 132 and is configured to provide at an output a filtered phase error signal labeled PHERF. In this embodiment, the filter circuit 134 is characterized as an FIR filter. In this embodiment, the output of the filter circuit 134 is coupled to a first terminal of the switch 138 for providing the PHERF signal to the phase rotator portion 120 and the storage unit 136 when the switch 138 is closed. In other embodiments, the output of the mixer circuit 132 may be coupled to the first terminal of the switch 138 for providing the unfiltered PHERR signal the phase rotator portion 120 and the storage unit 136 when the switch 138 is closed.

The switch circuit 138 includes a second terminal coupled to the storage unit 136 and to the phase rotator portion 120 at the CIN input. In this embodiment, the switch 138 is configured to be closed during a calibration mode and open during a normal operating mode of the phase rotator portion 120. The storage unit 136 serves as a look-up table, for example, and is configured for storing phase error values computed for respective PHIN signal values. Phase error values may be retrieved from the storage unit 136 and applied at the CIN input of the mixer circuit 106 to pre-distort the PHIN signal during normal operation as well as during the calibration mode. For example, during the calibration mode, the phase of the PHIN signal may be swept from 0 to 360 degrees in predetermined increments (e.g., 3 degree increments) and a corresponding phase error value is determined for each increment then written into the storage unit 136. On a subsequent iteration, as the PHIN signal is swept from 0 to 360 degrees, the corresponding stored phase error values are read from the storage unit 136 and applied at the CIN input to pre-distort the PHIN signal and compensate for analog imperfections, for example. Corresponding phase error values are determined for each increment based on the pre-distorted PHIN signal then written into the storage unit 136 as refined phase error values. Control circuitry (not shown) may be coupled to the storage unit 136 to control operations such as reading and writing storage locations within the storage unit 136. The storage unit 136 may be formed from any suitable volatile or non-volatile memory elements or combinations thereof.

Figure 2:
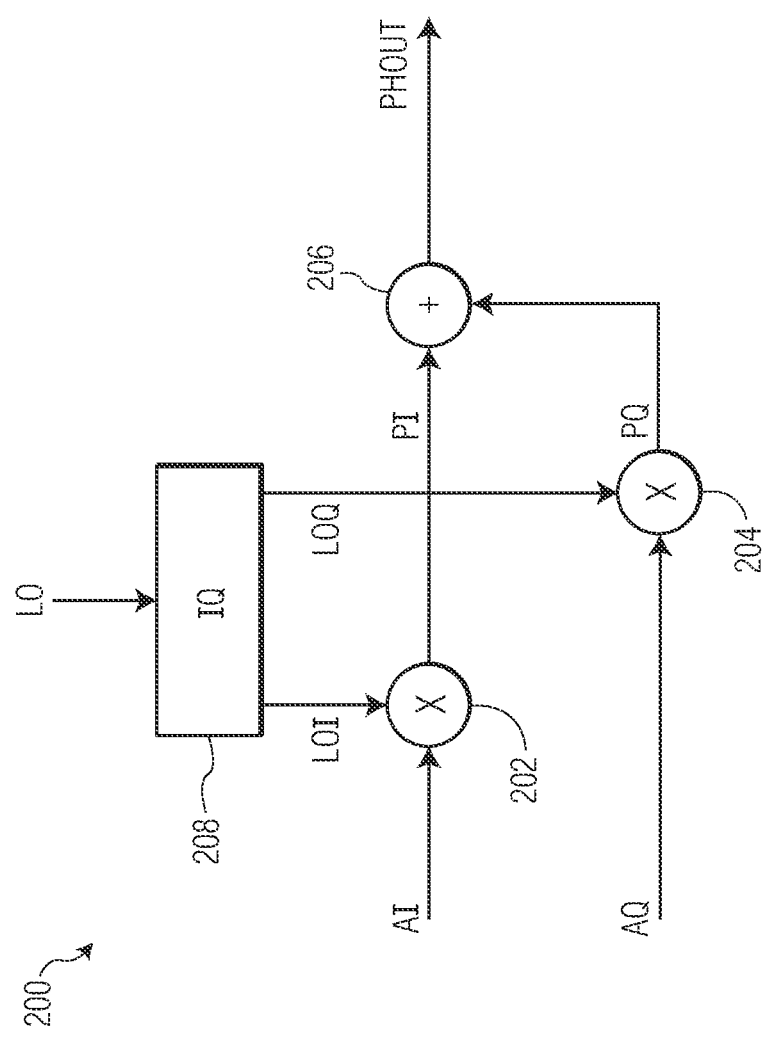
FIG. 2 illustrates, in simplified block diagram form, an example phase rotator core in accordance with an embodiment.

FIG. 2 illustrates, in simplified block diagram form, an example phase rotator core implementation 200 of the circuit block 112 of FIG. 1 in accordance with an embodiment. The phase rotator core 112 is configured and arranged to receive the AI and AQ signals, the LO signal, and in turn, generate the PHOUT signal. In this embodiment, phase rotator core 200 includes an IQ quadrature splitter circuit block 208 labeled IQ, multiplication mixer circuits 202 and 204 and summing circuit 206.

The IQ circuit block 208 is configured and arranged to receive the LO RF signal and in turn, generate a corresponding complex (IQ) RF signal consisting of a first (I) signal component labeled LOI and a second (Q) signal component labeled LOQ. In this embodiment, the LOI signal component is characterized as an in-phase signal being substantially in phase with the received LO signal and the LOQ signal component is characterized as a quadrature signal being substantially 90 degrees out of phase with the received LO signal.

A first input of mixer 202 is configured to receive the LOI signal, a second input of mixer 202 is configured to receive the AI signal, and an output of mixer 202 is configured to provide a first product signal labeled PI. A first input of mixer 204 is configured to receive the LOQ signal, a second input of mixer 204 is configured to receive the AQ signal, and an output of mixer 204 is configured to provide a second product signal labeled PQ. A first input of mixer 206 is configured to receive the PT signal, a second input of mixer 206 is configured to receive the PQ signal, and an output of mixer 206 is configured to provide a summed output signal labeled PHOUT.

Figure 3:
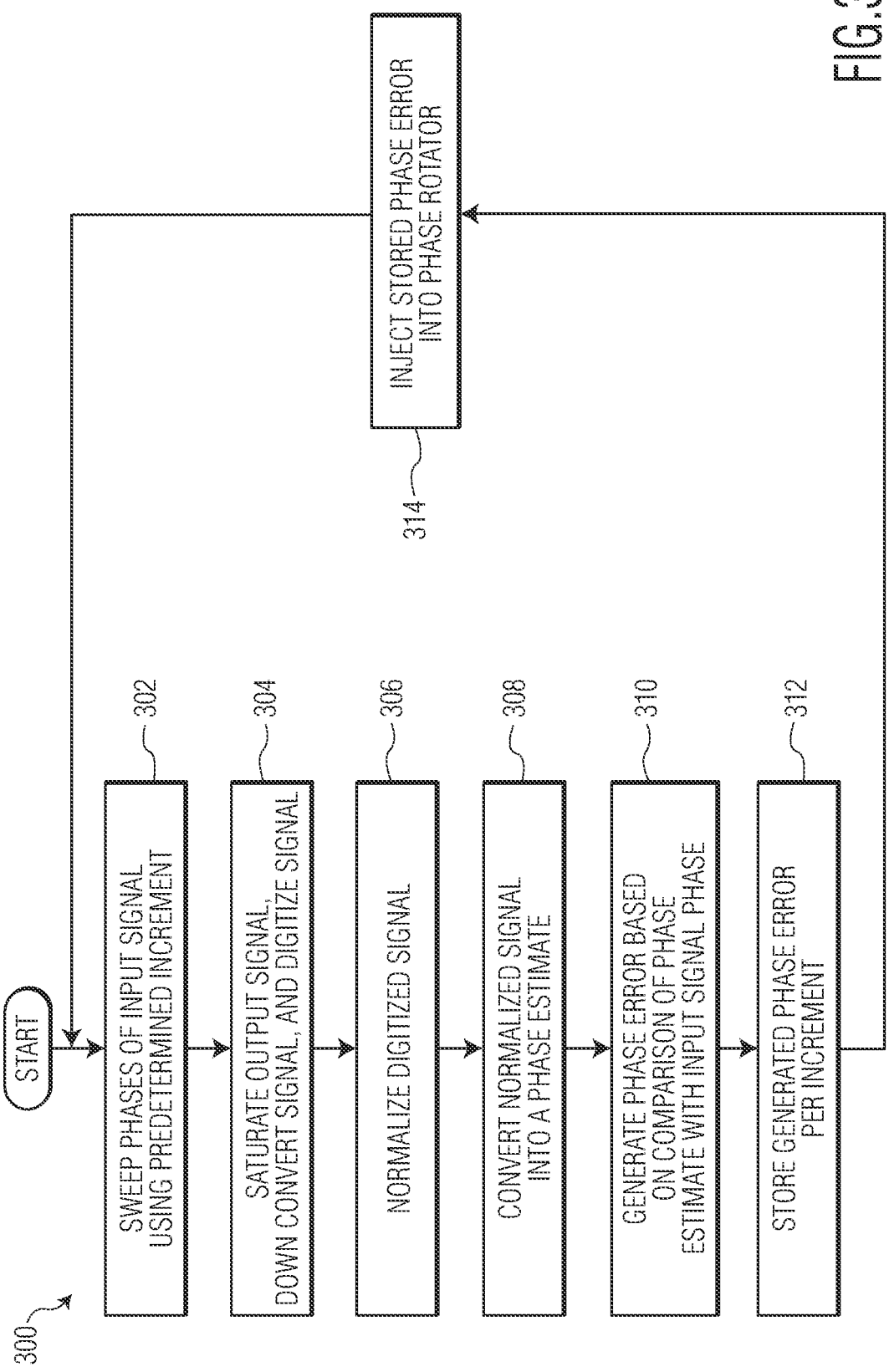
FIG. 3 illustrates, in simplified flow diagram form, an example calibration method in accordance with an embodiment.

FIG. 3 illustrates, in simplified flow diagram form, an example calibration method 300 in accordance with an embodiment. In this embodiment, steps of the calibration method 300 correspond to operation of the phase rotator calibration system 100 during a calibration mode.

At step 302, sweep phases of the input signal PHIN using a predetermined increment. In this embodiment, a control circuit is configured to sweep the PHIN signal over a range of phases in predetermined increments during a calibration mode of the phase rotator calibration system 100. For example, the phase of the PHIN signal may be swept from 0 to 360 degrees in 3 degree increments for a total of 120 increments. In this embodiment, any suitable range of phases may be swept. The predetermine increment value may be chosen or determined based on a minimum step required to guarantee a specification or performance target of the phase rotator 120, for example.

At step 304, saturate the output signal PHOUT, down-convert the saturated PHOUT signal, and digitize the down-converted signal into a digital signal. In this embodiment, for each phase increment, a corresponding PHOUT signal is saturated by way of the saturation circuit 122 to form a saturated version of the PHOUT signal. The saturated PHOUT signal 123 is then down-converted by way of the mixer circuit 124 to form a down-converted signal 125. The down-converted signal 125 is then converted to a digital signal 127 by way of the ADC 126. At this step, the digital signal 127 corresponds to the down-converted, saturated version of the PHOUT signal.

At step 306, normalize the digitized signal. In this embodiment, the digital signal 127 corresponding to the down-converted, saturated version of the PHOUT signal is normalized by way of the normalization circuit 128 to form a normalized digital signal 129. For example, as the PHIN signal is swept over a range of phases, the resulting digital signal 127 is converted to a normalized digital signal 129 within a range having a minimum value of −1.0 and a maximum value of 1.0.

At step 308, convert the normalized signal into a phase estimate and compare with the input signal phase. In this embodiment, the normalized digital signal 129 is converted digitally into a phase estimate PHEST by way of an arccosine function performed by the arccosine circuit 130.

At step 310, generate phase error based on a comparison of the phase estimate PHEST with the input signal PHIN phase. In this embodiment, the PHEST signal is compared with the PHIN signal by way of the mixer 132 to generate the phase error signal PHERR. For example, the PHEST signal and the PHIN signal are received at inputs of the mixer 132, and in turn, the PHERR signal is generated at an output of the mixer 132 as a difference between the PHEST signal and the PHIN signal. At this step, the generated PHERR signal may be filtered by way of the filter circuit 134 to form the filtered phase error signal PHERF.

At step 312, store generated phase error PHERR per increment. In this embodiment, for each phase increment, a corresponding PHERR value is stored by way of the storage unit 136. For example, as the phase of the PHIN signal is swept over a range of 0 to 360 degrees, a PHERR is generated for each 3 degree phase increment of the PHIN signal thus forming a look-up table having 120 PHERR values stored (e.g., written) in the storage unit 136. Alternatively, the filtered phase error signal PHERF values may be stored for each phase increment rather than the raw PHERR signal values. In this embodiment, the storage unit 136 may be formed from any suitable volatile or non-volatile memory elements or combinations thereof.

At step 314, inject stored phase error into the phase rotator circuit 120. In this embodiment, the phase error (e.g., PHERR, PHERF) values are retrieved (e.g., read) from the storage unit 136 and injected into the phase rotator circuit 120 by way of the mixer 106 to pre-distort the PHIN signal (e.g., Q signal component path). The control circuit of step 302 configured to sweep the PHIN signal over the range of phases in predetermined increments may be further configured to retrieve corresponding phase error values from the storage unit 136 and apply those phase error values at the CIN input of the mixer 106 during a calibration mode or a normal operational mode. For example, for each phase of the PHIN signal, a corresponding phase error value may be retrieved and applied at the CIN input to pre-distort the PHIN signal, thus providing an adjusted or calibrated PHOUT signal associated with each phase. In this embodiment, during the normal operational mode, the storage unit 136 would serve as a look-up table such that for each PHIN phase, a corresponding phase error value is retrieved and used to pre-distort the PHIN signal to provide a calibrated PHOUT signal. During the calibration mode, several iterations may be performed such that the phase error values stored in the storage unit 136 are further refined thus improving overall calibration of the PHOUT signal.

Figure 4:
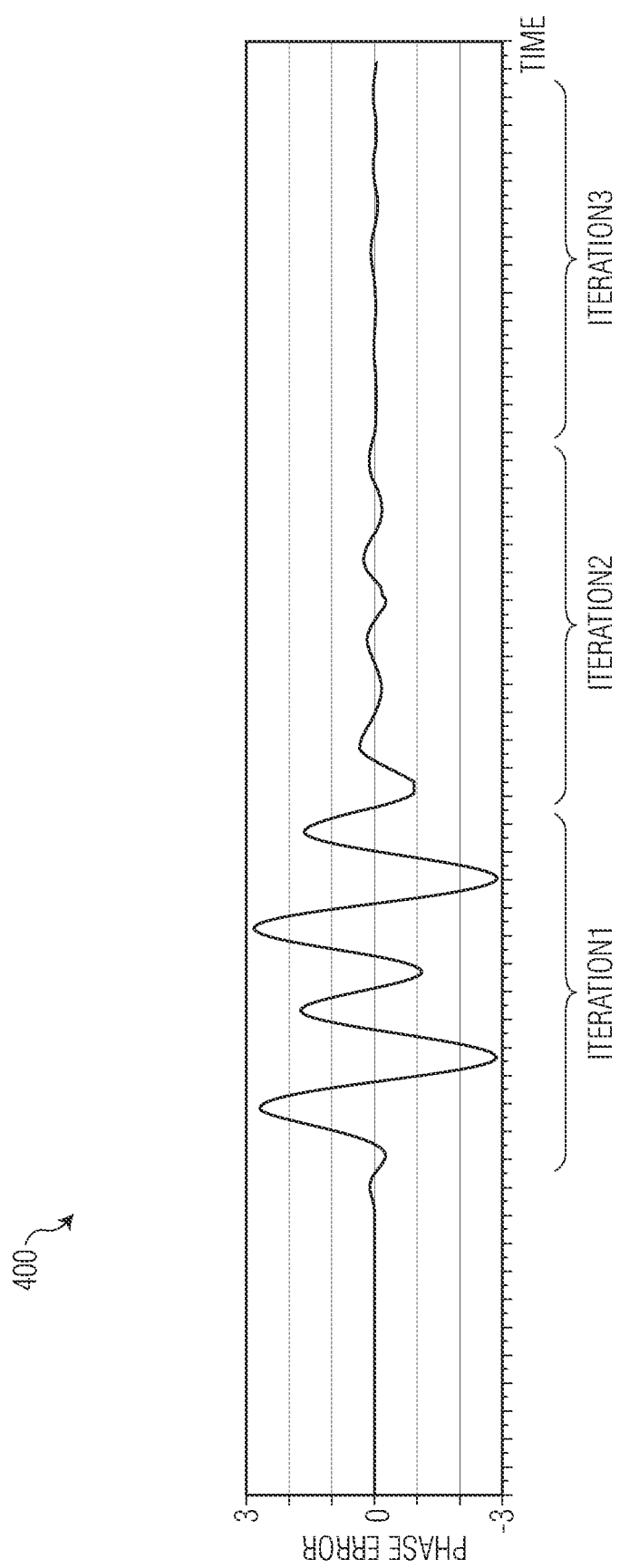
FIG. 4 illustrates, in simplified plot diagram form, an example simulation result in accordance with an embodiment.

FIG. 4 illustrates, in simplified plot diagram form, an example simulation result of the example phase rotator calibration system 100 depicted in FIG. 1 in accordance with an embodiment. The plot diagram 400 includes the phase error signal PHERF waveform corresponding to three successive iterations of the calibration method 300. The PHERF waveform is shown with phase error values on the Y-axis and time values on the X-axis.

By way of example, the simulation result of the phase rotator calibration system 100 during a calibration mode is further depicted in the following. In this example, it may be desirable to sweep the phase of the PHIN signal in 3 degree increments over a range of 0 to 360 degrees. The phase of the PHIN signal is incremented in 1 microsecond steps to generate each incremented phase (e.g., 3, 6, 9, . . . 360 degrees). During a first iteration (e.g., ITERATION1), a first phase error value is determined by way of the calibration circuit 140 for each incremented phase and stored in the storage unit 136. The first phase error value for each incremented phase is plotted versus time in FIG. 4. The ITERATION1 portion of the simulated PHERF waveform shows phase error values exceeding +/−2 degrees.

During a second iteration (e.g., ITERATION2), phase error values stored in the storage unit 136 during the first iteration are retrieved and applied at the CIN input of the mixer 106 to pre-distort the PHIN signal for each incremented phase. A second phase error value is determined by way of the calibration circuit 140 for each incremented phase and stored in the storage unit 136. The second phase error value for each incremented phase is plotted in the ITERATION2 portion of the simulated PHERF waveform showing improved phase error values.

During a third iteration (e.g., ITERATION3), the improved phase error values stored in the storage unit 136 during the second iteration are retrieved and applied at the CIN input of the mixer 106 to pre-distort the PHIN signal for each incremented phase. A third phase error value is determined by way of the calibration circuit 140 for each incremented phase and stored in the storage unit 136. The third phase error value for each incremented phase is plotted in the ITERATION3 portion of the simulated PHERF waveform showing further improved phase error values substantially approaching 0 degrees. In some embodiments, it may be desirable to sweep the phase of the PHIN signal in over the range of 0 to 360 degrees in sequential order for the first and second iterations, then sweep the phase of the PHIN signal in over the range in a non-sequential (e.g., random) order for the third iteration to further optimize the calibration process.

In this example, the calibration process is considered completed upon reaching a target phase error result of substantially 0 degrees at completion of the third iteration. After the calibration process completes, switch 138 is opened and the phase rotator circuit 120 resumes operation in the normal operational mode.

Generally, there is provided, a circuit including a phase rotator portion having input for receiving an input signal and an output for providing an output signal; and a calibration portion coupled to the phase rotator portion, the calibration portion configured to determine a phase error based on a phase estimation, the phase estimation generated by way of an arccosine function. The calibration portion may include an arccosine circuit block configured to generate the phase estimation based on a digital signal corresponding to the output signal. The calibration portion may be further configured to determine the phase error as a difference between the generated phase estimation and the input signal. The circuit may further include a storage unit coupled to the phase rotator portion, the storage unit configured to store a phase error value representative of the phase error. The phase rotator portion may be configured to pre-distort the input signal based on the stored phase error value and generate an adjusted output signal at the output based on the pre-distorted input signal. The phase rotator portion may further include a mixer having a first input coupled to the input of the phase rotator portion and a second input coupled to the storage unit and to the calibration portion, the mixer configured to receive the input signal at the first input and the phase error at the second input and provide a summed signal at an output signal. The calibration portion may further include a saturation circuit coupled to receive the output signal and configured to generate a saturated signal corresponding to the output signal; and a mixer configured to down convert the saturated signal to form a down converted signal. The calibration portion may further include an analog to digital converter (ADC), the ADC configured to receive the down converted signal and generate a digital signal, the arccosine function utilizing a normalized version of the digital signal to generate the phase estimation. The circuit may further include a switch coupled between the phase rotator portion and an output of the calibration portion, the switch configured to be closed during a calibration operation.

In another embodiment, there is provided, a method including generating an output signal at an output of a phase rotator based on a phase signal received at an input of the phase rotator; coupling a calibration circuit to the phase rotator; receiving the output signal of the phase rotator at an input of the calibration circuit; generating a phase estimate by way of an arccosine function of the calibration circuit, the arccosine function configured to generate the phase estimate based on a digital signal corresponding to the output signal; and determining a phase error based on the phase estimate. The determining the phase error may include determining a difference between the generated phase estimate and the phase signal. The method may further include storing a phase error value in a storage unit coupled to the input of the phase rotator, the phase error value representative of the phase error. The method may further include retrieving the phase error value from the storage unit to pre-distort the phase signal based on the phase error value; and generating an adjusted output signal at the output phase rotator based on the pre-distorted phase signal. The method may further include saturating by way of a saturation circuit the received output signal to form a saturated signal corresponding to the output signal; and down converting by way of a mixer the saturated signal to form a down converted signal. The method may further include generating the digital signal by way of an analog to digital converter (ADC), the ADC configured to receive the down converted signal.

In yet another embodiment, there is provided, a circuit including a phase rotator portion having input for receiving a phase signal and an output for providing an output signal; and a calibration portion coupled to the phase rotator portion, the calibration portion configured to determine a phase error as a difference between a phase estimation and the input signal, the calibration portion including an arccosine circuit block configured to generate the phase estimation based on a digital signal corresponding to the output signal. The circuit may further include a storage unit coupled to the phase rotator portion, the storage unit configured to store a phase error value representative of the phase error. The phase rotator portion may be configured to pre-distort the phase signal based on the stored phase error value and generate a calibrated output signal at the output based on the pre-distorted phase signal. The circuit may further include a switch coupled between the phase rotator portion and an output of the calibration portion, the switch configured to be open during normal operation of the phase rotator portion. The calibration portion may further include a saturation circuit coupled to receive the output signal and configured to generate a saturated signal corresponding to the output signal; a mixer configured to down convert the saturated signal to form a down converted signal; and an analog to digital converter (ADC) configured to receive the down converted signal and generate the digital signal.

By now it should be appreciated that there has been provided, a phase rotator calibration system including a calibration circuit configured to determine a phase error based on a phase estimation during a calibration mode. The phase estimation is generated digitally by way of an arccosine function. Phase error values are determined for an input signal swept over a range of phases in predetermined increments. A storage unit is utilized to store the phase error values during the calibration mode. The storage unit serves as a look-up table to pre-distort the input signal during a normal operating mode thus providing a calibrated phase rotator output signal.

Generally, there is provided, a phase rotator calibration system. The phase rotator calibration system includes a phase rotator portion having input for receiving an input signal and an output for providing an output signal. A calibration portion is coupled to the phase rotator portion. The calibration portion is configured to determine a phase error based on a phase estimation. The phase estimation is generated by way of an arccosine function.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit comprising:
a phase rotator portion having input for receiving an input signal and an output for providing an output signal; and
a calibration portion coupled to the phase rotator portion, the calibration portion configured to determine a phase error based on a phase estimation, wherein the phase estimation is generated by way of an arccosine function, wherein the calibration portion comprises:
a saturation circuit coupled to receive the output signal and configured to generate a saturated signal corresponding to the output signal; and
a mixer configured to down convert the saturated signal to form a down converted signal.

2. The circuit of claim 1, wherein the calibration portion further comprises:
an arccosine circuit block configured to generate the phase estimation based on a digital signal corresponding to the output signal.

3. The circuit of claim 1, wherein the calibration portion is further configured to determine the phase error as a difference between the generated phase estimation and the input signal.

4. The circuit of claim 1, further comprising:
a storage unit coupled to the phase rotator portion, the storage unit configured to store a phase error value representative of the phase error.

5. The circuit of claim 4, wherein the phase rotator portion is configured to pre-distort the input signal based on the stored phase error value and generate an adjusted output signal at the output based on the pre-distorted input signal.

6. The circuit of claim 4, wherein the phase rotator portion further comprises:
a mixer having a first input coupled to the input of the phase rotator portion and a second input coupled to the storage unit and to the calibration portion, the mixer configured to receive the input signal at the first input and the phase error at the second input and provide a summed signal at an output signal.

7. The circuit of claim 1, wherein the calibration portion further comprises:
an analog to digital converter (ADC), the ADC configured to receive the down converted signal and generate a digital signal, the arccosine function utilizing a normalized version of the digital signal to generate the phase estimation.

8. The circuit of claim 1, further comprising:
a switch coupled between the phase rotator portion and an output of the calibration portion, the switch configured to be closed during a calibration operation.

9. A method comprising:
generating an output signal at an output of a phase rotator based on a phase signal received at an input of the phase rotator;
coupling a calibration circuit to the phase rotator;
receiving the output signal of the phase rotator at an input of the calibration circuit;
saturating, by a saturation circuit in the calibration circuit, the received output signal to form a saturated signal corresponding to the output signal;
down converting, by a mixer in the calibration circuit, the saturated signal to form a down converted signal;
generating a phase estimate by way of an arccosine function of the calibration circuit, the arccosine function configured to generate the phase estimate based on a digital signal corresponding to the down converted signal; and
determining a phase error based on the phase estimate.

10. The method of claim 9, wherein determining the phase error comprises determining a difference between the generated phase estimate and the phase signal.

11. The method of claim 9, further comprising:
storing a phase error value in a storage unit coupled to the input of the phase rotator, the phase error value representative of the phase error.

12. The method of claim 11, further comprising:
retrieving the phase error value from the storage unit to pre-distort the phase signal based on the phase error value; and
generating an adjusted output signal at the output phase rotator based on the pre-distorted phase signal.

13. The method of claim 9, further comprising:
generating the digital signal by way of an analog to digital converter (ADC), the ADC configured to receive the down converted signal.

14. A circuit comprising:
a phase rotator portion having input for receiving a phase signal and an output for providing an output signal; and
a calibration portion coupled to the phase rotator portion, the calibration portion configured to determine a phase error as a difference between a phase estimation and the input signal, the calibration portion comprising:
a saturation circuit coupled to receive the output signal and configured to generate a saturated signal corresponding to the output signal;
a mixer configured to down convert the saturated signal to form a down converted signal;
an analog to digital converter (ADC) configured to receive the down converted signal and generate a digital signal; and
an arccosine circuit block configured to generate the phase estimation based on the digital signal.

15. The circuit of claim 14, further comprising:
a storage unit coupled to the phase rotator portion, the storage unit configured to store a phase error value representative of the phase error.

16. The circuit of claim 15, wherein the phase rotator portion is configured to pre-distort the phase signal based on the stored phase error value and generate a calibrated output signal at the output based on the pre-distorted phase signal.

17. The circuit of claim 14, further comprising:
a switch coupled between the phase rotator portion and an output of the calibration portion, the switch configured to be open during normal operation of the phase rotator portion.

* * * * *